US010649137B1

(12) United States Patent
Preisler et al.

(10) Patent No.: US 10,649,137 B1
(45) Date of Patent: May 12, 2020

(54) SILICON-ON-INSULATOR (SOI) DIE INCLUDING A LIGHT EMITTING LAYER PEDESTAL-ALIGNED WITH A LIGHT RECEIVING SEGMENT

(71) Applicant: Newport Fab, LLC, Newport Beach, CA (US)

(72) Inventors: Edward Preisler, San Clemente, CA (US); Oleg Martynov, Oceanside, CA (US); Farnood Rezaie, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/391,171

(22) Filed: Apr. 22, 2019

(51) Int. Cl.
*G02B 6/12* (2006.01)
*G02B 6/136* (2006.01)
*H01L 25/16* (2006.01)
*G02B 6/42* (2006.01)

(52) U.S. Cl.
CPC ......... *G02B 6/12002* (2013.01); *G02B 6/136* (2013.01); *G02B 6/4228* (2013.01); *H01L 25/167* (2013.01); *G02B 2006/12061* (2013.01); *G02B 2006/12121* (2013.01); *G02B 2006/12123* (2013.01); *G02B 2006/12173* (2013.01); *G02B 2006/12176* (2013.01)

(58) Field of Classification Search
None
See application file for complete search history.

(56) References Cited

U.S. PATENT DOCUMENTS

| | | | | |
|---|---|---|---|---|
| 2004/0028312 A1* | 2/2004 | Park | ................... | G02B 6/12004 385/14 |
| 2007/0253670 A1* | 11/2007 | Watanabe | .......... | G02B 6/12004 385/129 |
| 2011/0085760 A1* | 4/2011 | Han | ....................... | G02B 6/423 385/14 |
| 2014/0319656 A1* | 10/2014 | Marchena | ............... | H01L 24/83 257/615 |
| 2015/0277044 A1* | 10/2015 | Hatori | ................. | G02B 6/1228 385/43 |
| 2017/0031102 A1* | 2/2017 | Ku | ....................... | H04B 10/079 |

* cited by examiner

*Primary Examiner* — Michael Stahl
(74) *Attorney, Agent, or Firm* — Farjami & Farjami LLP

(57) ABSTRACT

There are disclosed herein various implementations of a silicon-on-insulator (SOI) die including a light emitting layer pedestal-aligned with a light receiving segment, as well as methods for fabricating such an SOI die. The SOT die includes a pedestal region of the SOI die having a pedestal including a thin top silicon segment, a buried oxide (BOX) segment, and a handle wafer segment. The SOI die also includes an integrated circuit (IC) region having a thin silicon waveguide that is aligned with the thin top silicon segment in the pedestal region. A light emitting layer is situated over the pedestal in the pedestal region, the light emitting layer being aligned with the light receiving segment to situated over the thin silicon waveguide in the IC region.

20 Claims, 15 Drawing Sheets

US 10,649,137 B1

SILICON-ON-INSULATOR (SOI) DIE INCLUDING A LIGHT EMITTING LAYER PEDESTAL-ALIGNED WITH A LIGHT RECEIVING SEGMENT

BACKGROUND

Photonics systems designed to generate, guide, modulate, and sense light have many important commercial applications as well as applications in technology and science. Examples of applications in which photonics systems may be used to advantage include telecommunications, signal processing, optical computing, holography, and medicine, to name a few. Silicon photonics utilizes silicon as an optical medium, thereby further advantageously enabling the integration of photonic devices and electronic components on the same silicon die.

The fabrication of a silicon die including photonic devices and electronic components may be performed using conventional semiconductor fabrication facilities and many conventional techniques. Nevertheless, the alignment of light emitting devices with optical components for guiding the emitted light through the silicon die imposes new constraints on conventional semiconductor processing techniques. Because precise alignment of light emitting with light guiding features can be critical to device and system performance, there is a need in the art for new techniques for integrating photonics devices with electronic circuitry on a silicon die.

SUMMARY

The present disclosure is directed to a silicon-on-insulator (SOI) die including a light emitting layer pedestal-aligned with a light receiving segment, as shown in and/or described in connection with at least one of the figures, and as set forth in the claims.

DETAILED DESCRIPTION

Figure 1:
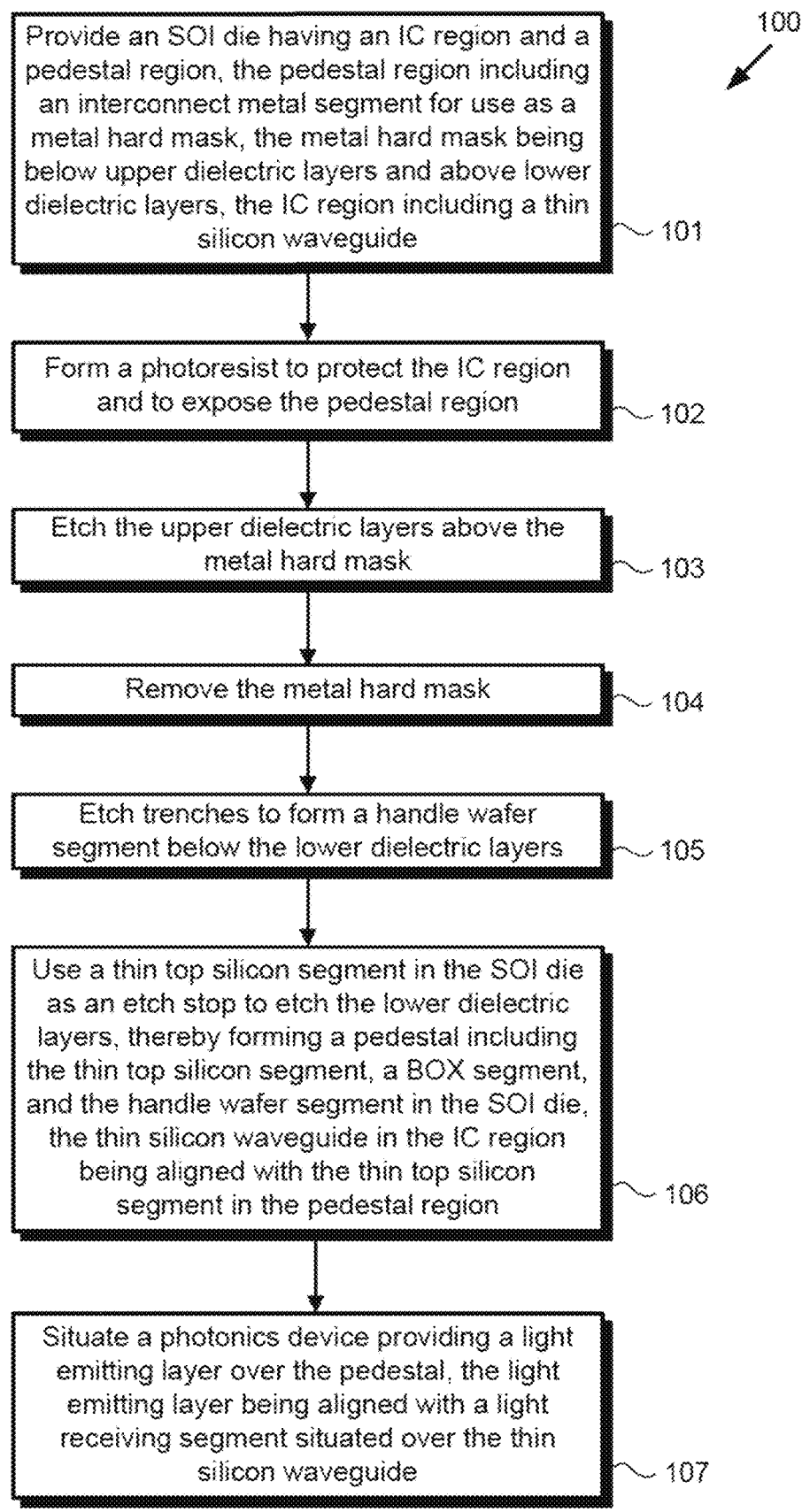
FIG. 1 shows a flowchart presenting an exemplary method for fabricating a silicon-on-insulator (SOI) die including a light emitting layer pedestal-aligned with a light receiving segment, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings an illustrations in the present application are generally not to scale, and are not intended to correspond to actual relative dimensions.

As stated above, silicon photonics utilizes silicon as an optical medium, thereby advantageously enabling the integration of photonic devices and electronic components on the same silicon die. The fabrication of such a silicon die including photonic devices and electronic components may be performed using conventional semiconductor fabrication facilities and many conventional techniques. Nevertheless and as further stated above, the alignment of light emitting devices with optical components for guiding the emitted light through the silicon die imposes new constraints on conventional semiconductor processing techniques. Because precise alignment of light emitting with light guide features can be critical to device and system performance, there is a need for new techniques for integrating photonics devices with electronic circuitry on a silicon die.

The present application is directed to a silicon-on-insulator (SOI) die including a light emitting layer pedestal-aligned with a light receiving segment and methods for its fabrication that address and overcome the problems in the conventional art. Such a fabrication method includes using a metal segment patterned from one of a first-level, second-level, or subsequent level metal layer metallization as a metal hard mask providing an etch stop during removal of upper dielectric layers from a pedestal region of the SOI die. In addition, a top silicon layer of the SOI die used to form a thin silicon waveguide in an integrated circuit (IC) region of the SOI die also provides a thin top silicon segment in the pedestal region serving as an etch stop when forming a pedestal designed to support a photonics device. As a result, the present fabrication method and resulting SOI die advantageously ensure alignment of a light emitting layer of the photonics device in the pedestal region of the SOI die with a light receiving segment situated over the thin silicon waveguide in the IC region.

FIG. 1. shows flowchart 100 presenting an exemplary method for fabricating a silicon-on-insulator (SOI) die including a light emitting layer pedestal-aligned with a light receiving segment, according to one implementation. It is noted that certain details and features have been left out of flowchart 100 that are apparent to a person of ordinary skill in the art, in order not to obscure the discussion of the inventive features in the present application.

Figure 2A:
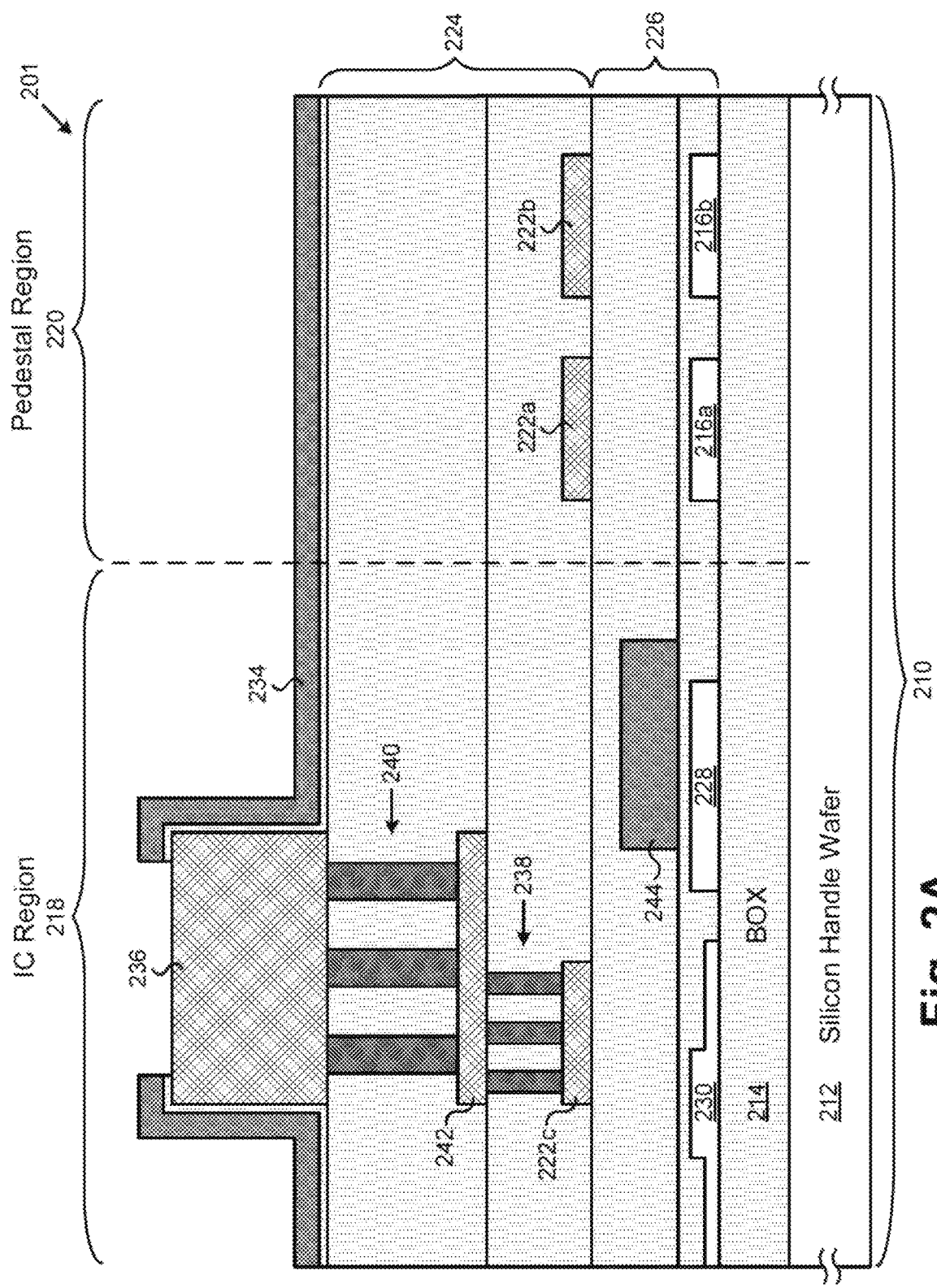
FIG. 2A shows a cross-sectional view of an exemplary structure corresponding to an initial fabrication stage according to the flowchart of FIG. 1, according to one implementation.
Figure 2B:
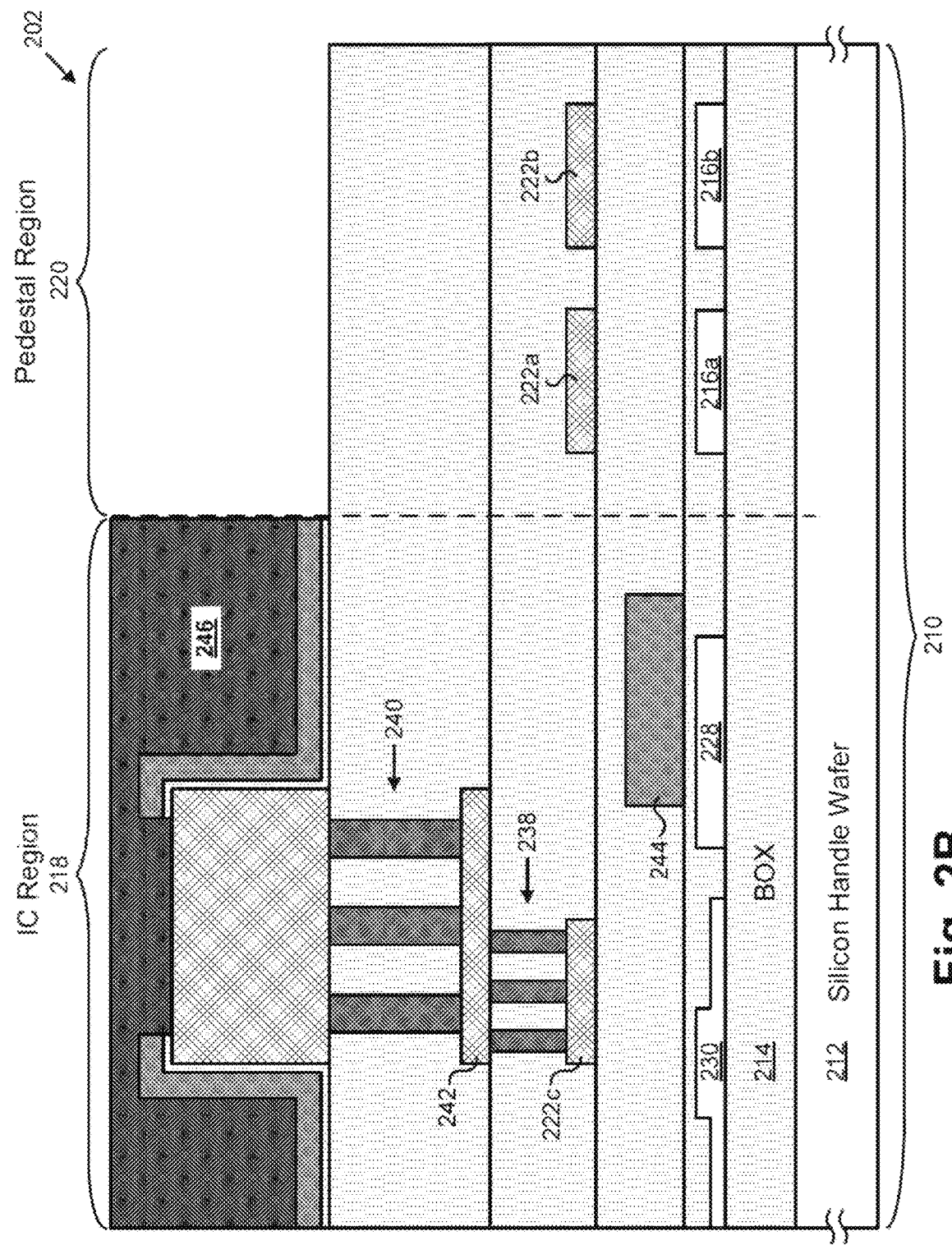
FIG. 2B shows a cross-sectional view of the exemplary structure of FIG. 2A at a subsequent fabrication stage according to the flowchart of FIG. 1.
Figure 2C:
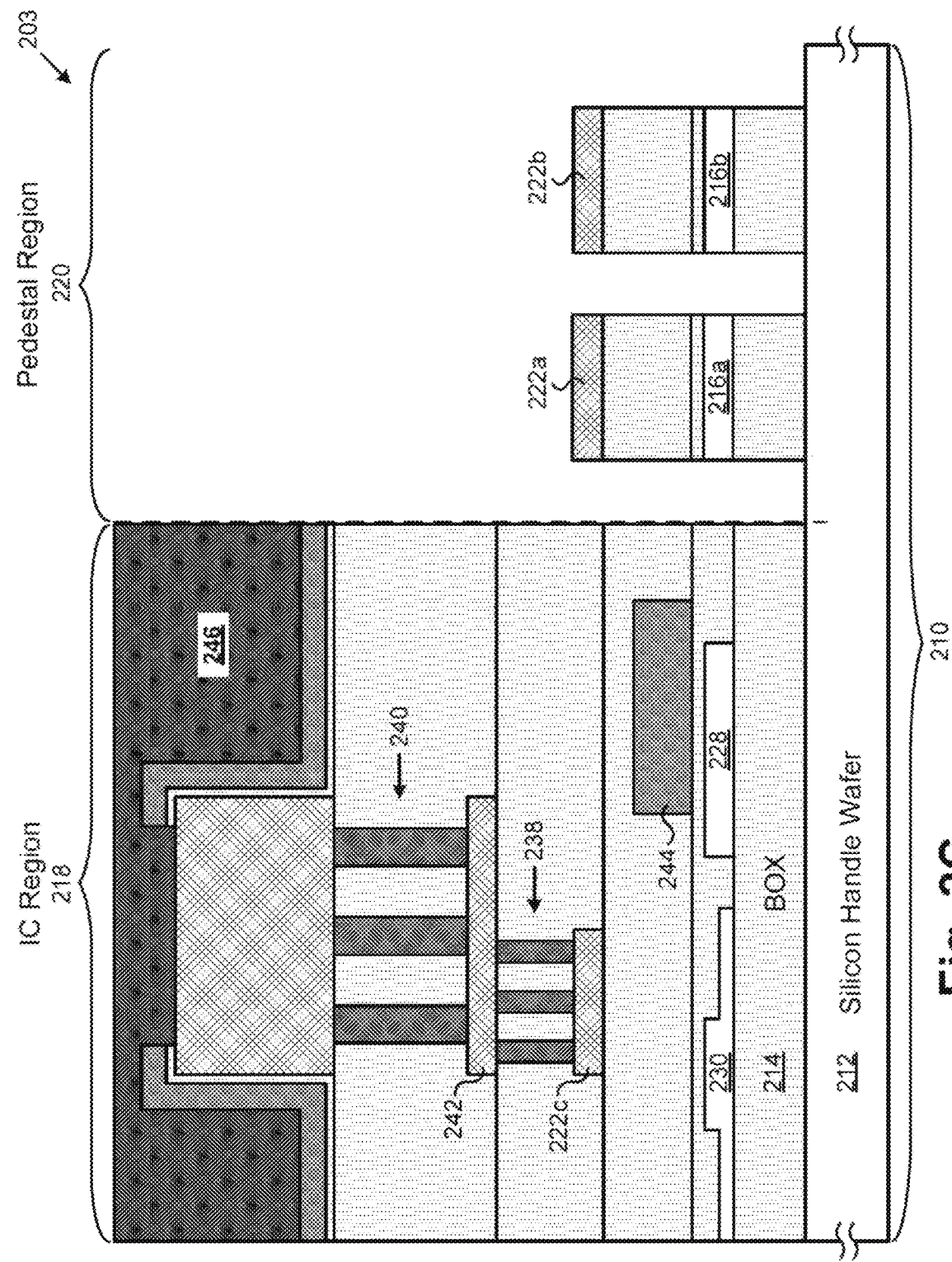
FIG. 2C shows a cross-sectional view of the exemplary structure of FIG. 2B at a subsequent fabrication stage according to the flowchart of FIG. 1.

With respect to FIGS. 2A, 2B, 2C, 2D, 2E, 2F, and 2G (hereinafter "FIGS. 2A-2G"), structures 201, 202, 203, 204, 205, 206, and 207 shown respectively in FIGS. 2A-2G illustrate the result of performing the method of flowchart 100, according to one implementation. For example, structure 201, in FIG. 2A, provides a cross-sectional view of SOI die 210 having IC region 218 including thin silicon waveguide 228 and waveguide 230, and having pedestal region 220 including interconnect metal segments 222a and 222b situated between upper dielectric layers 224 and lower dielectric layers 226 (action 101). Structure 202, in FIG. 2B, is a cross-sectional view of structure 201 after formation of photoresist to protect IC region 218 and to expose pedestal region 220 (action 102). Structure 203, in FIG. 2C, is a cross-sectional view of structure 202 after etching away of upper dielectric layers 224 above metal hard masks 222a and 222b (action 103), and so forth.

Figure 3A:
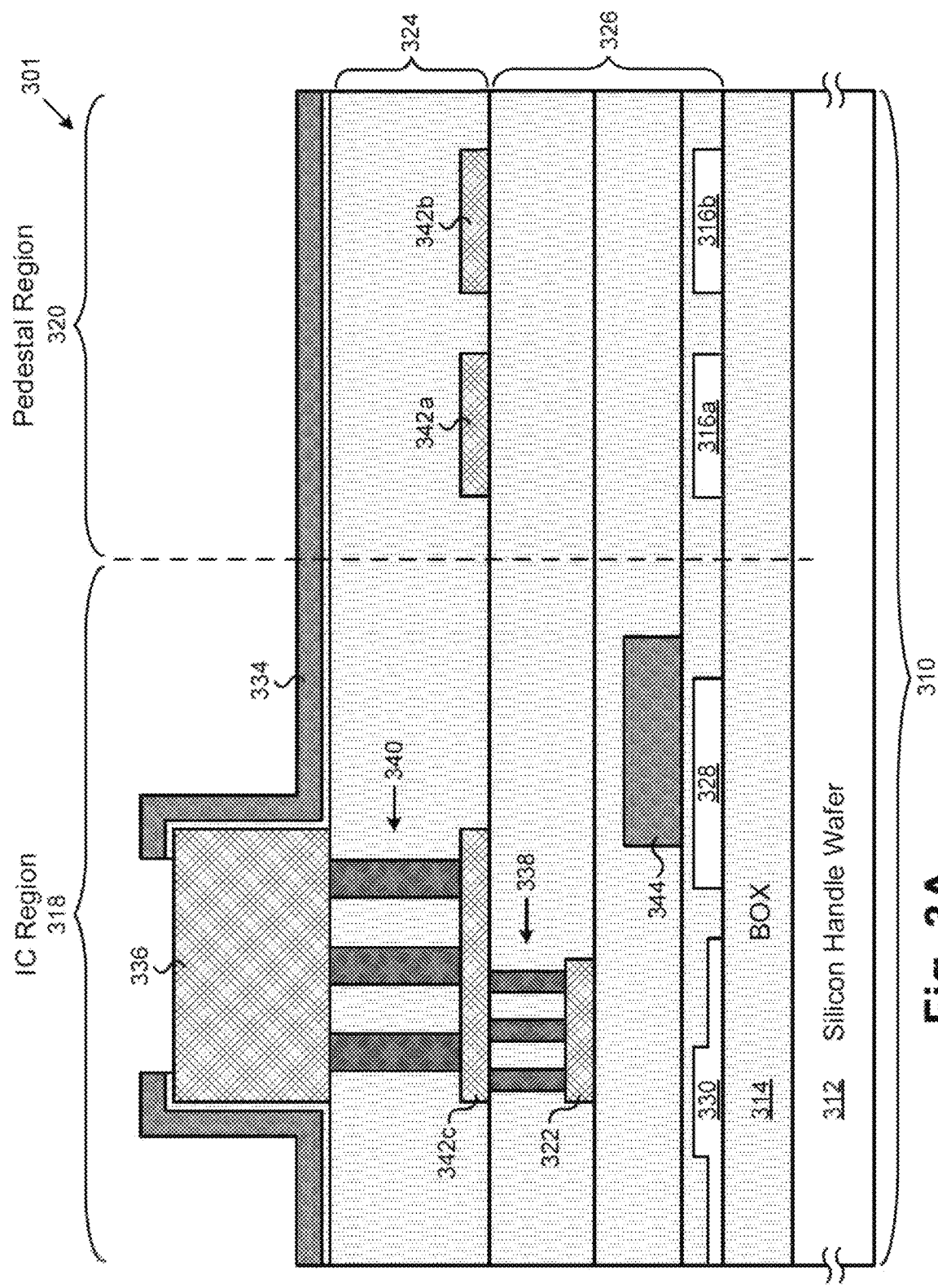
FIG. 3A shows a cross-sectional view of an exemplary structure corresponding to an initial fabrication stage according to the flowchart of FIG. 1, according to another implementation.
Figure 3B:
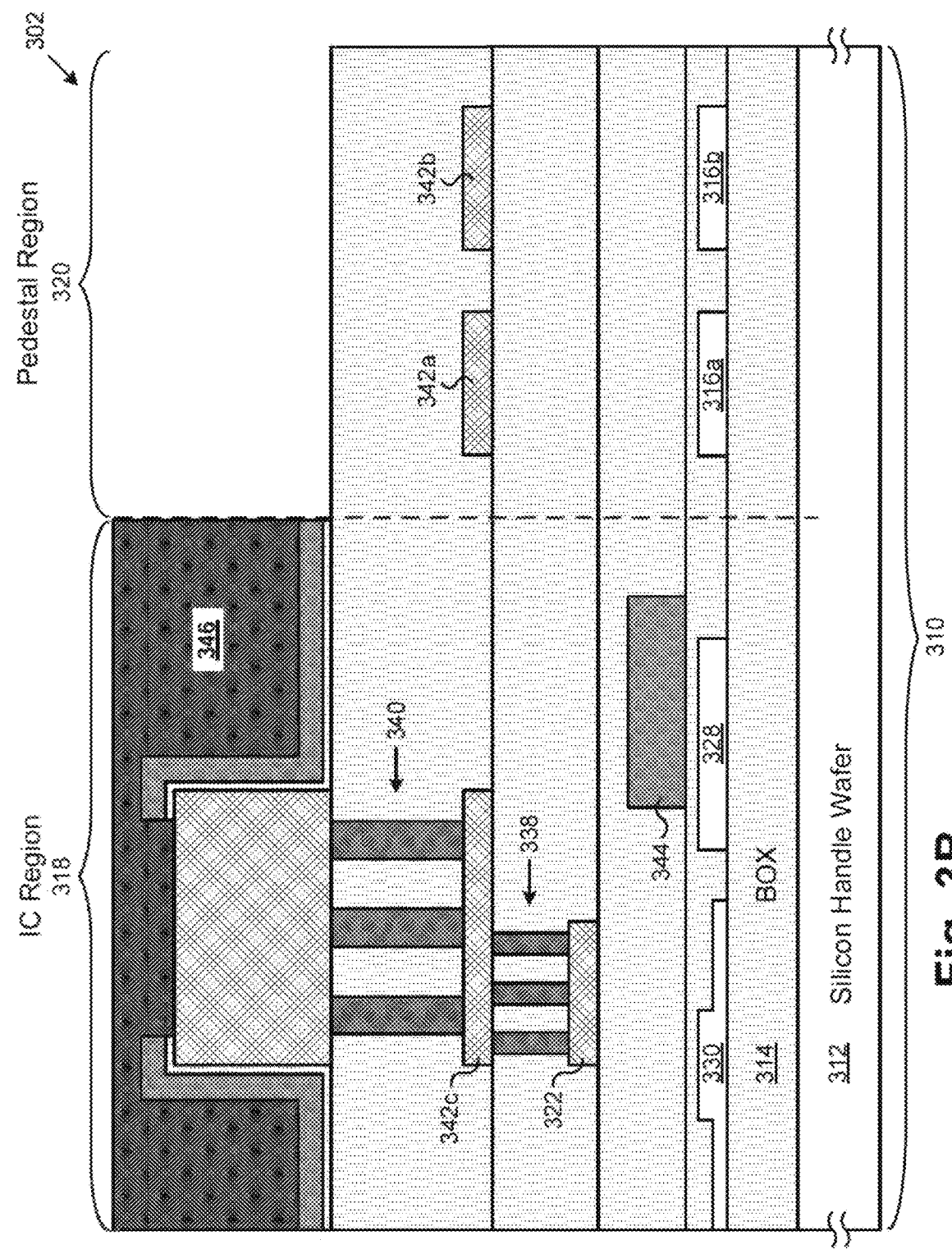
FIG. 3B shows a cross-sectional view of the exemplary structure of FIG. 3A at a subsequent fabrication stage according to the flowchart of FIG. 1.
Figure 3C:
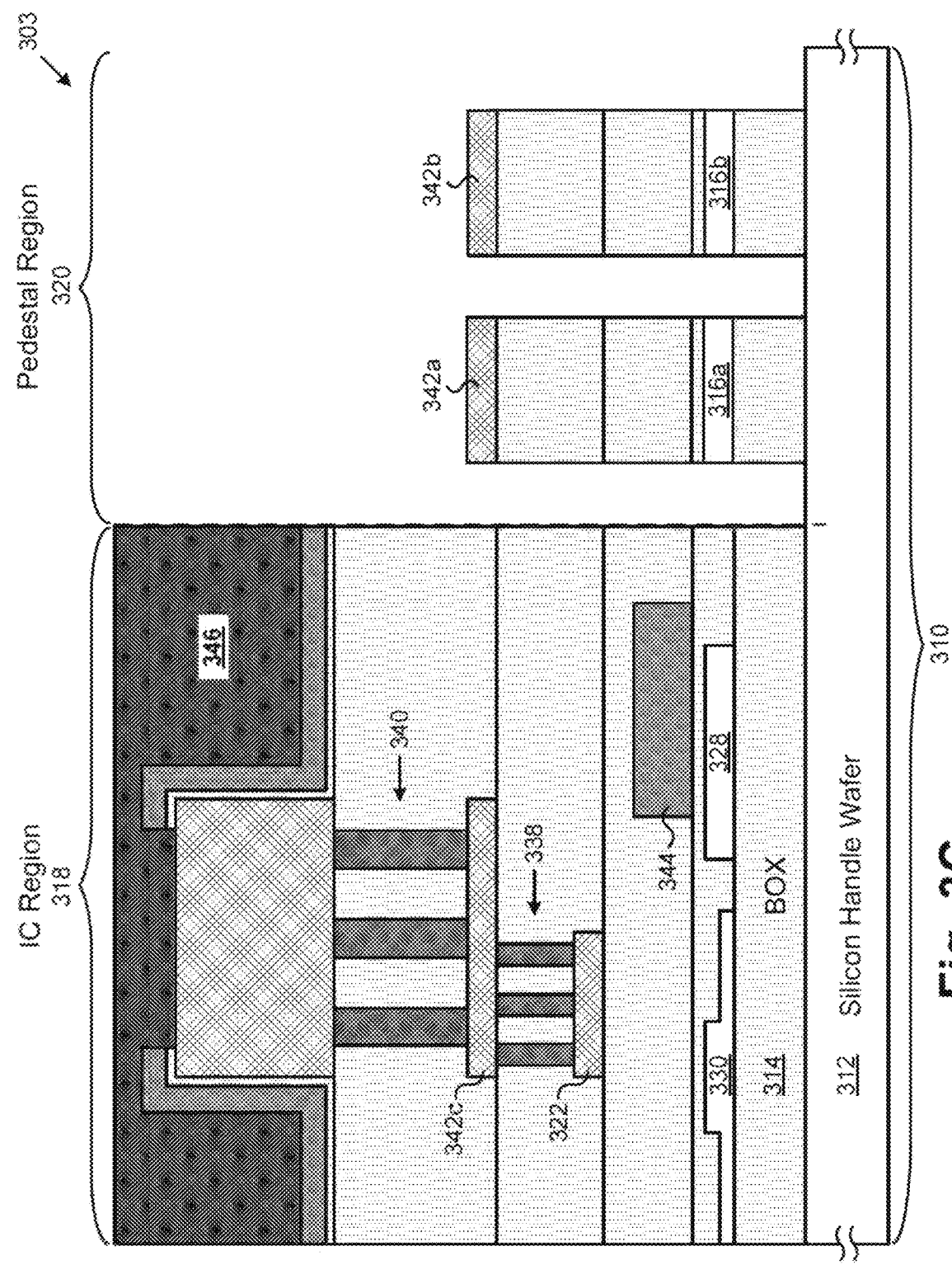
FIG. 3C shows a cross-sectional view of the exemplary structure of FIG. 3B at a subsequent fabrication stage according to the flowchart of FIG. 1.

Regarding FIGS. 3A, 3B, 3C, 3D, 3E, 3F, and 3G (hereinafter "FIGS. 3A-3G"), structures 301, 302, 303, 304, 305, 306, and 307 shown respectively in FIGS. 3A-3G illustrate the result of performing the method of flowchart 100, according to another implementation. Thus, structure 301, in FIG. 3A, provides a cross-sectional view of SOI die 310 having IC region 318 including thin silicon waveguide 328, and having pedestal region 320 including interconnect metal segments 342a and 342b situated between upper dielectric layers 324 and lower dielectric layers 326 and serving as metal hard masks (action 101). Structure 302, in FIG. 3B, shows the result of performing action 102 on structure 301. Structure 303, in FIG. 3C, shows the result of performing action 103 on structure 302, and so forth.

It is noted that the cross-sectional structures shown in FIGS. 2A-2G and 3A-3G are provided specific implementations of the present inventive principles, and are shown with such specificity for the purposes of conceptual clarity. Consequently, particular details such as the materials used to form the cross-sectional structures shown in FIGS. 2A-2G and 3A-3G, as well as the techniques used to produce the various depicted features, are being provided merely as examples, and should not be interpreted as limitations.

Referring to flowchart 100, in FIG. 1, in combination with FIG. 2A, flowchart 100 begins with providing SOI die 210 having IC region 218 and pedestal region 220, pedestal region 220 including interconnect metal segments 222a and 222b for use as metal hard masks (hereinafter "metal hard masks 222a and 222b"), metal hard masks 222a and 222b being below upper dielectric layers 224 and above lower dielectric layers 226, IC region 218 including thin silicon waveguide 228 (action 101). As shown in the cross-sectional view of FIG. 2A, SOI die 210 also includes silicon handle wafer 212, which may be a bulk silicon wafer, for example, and buried insulator layer 214 shown as an exemplary buried-oxide (BOX) layer situated between silicon handle wafer 212 and thin silicon waveguide 228, as well as waveguide 230 and thin top silicon segments 216a and 216b.

In addition, and as further shown in FIG. 2A, structure 201 includes light receiving segment 244, die pad 236, and interconnect metal segments 222c and 242 all situated in IC region 218. Structure 201 is also shown to include electrically conductive vias 240 electrically connecting die pad 236 to interconnect metal segment 242, and electrically conductive vias 238 electrically connecting die pad 236 and interconnect metal segment 242 to interconnect metal segment 222c in IC region 218. Also shown in FIG. 2A is passivation layer 234.

It is noted that thin silicon waveguide 228, waveguide 230, and thin top silicon segments 216a and 216b are patterned form the same thin top silicon layer of a SOI substrate of SOI die 210 also including silicon handle wafer 212 and buried insulator layer 214. Consequently, thin top silicon segments 216a and 216b are aligned with thin silicon waveguide 228. That is to say, thin top silicon segments 216a and 216b have substantially the same height or thickness as thin silicon waveguide 228, such as a height or thickness of approximately two hundred and twenty nanometers (220 nm), for example. Moreover, the respective top surfaces of thin top silicon segment 216a, thin top silicon segment 216b, and thin silicon waveguide 228 lie on the same horizontal plane substantially perpendicular to cross-sectional structure 201.

In some implementations, the SOI substrate of SOI die 210 may be formed by wafer bonding, whereby buried insulator layer 214 would be eventually situated between silicon handle wafer 212 and a thin top silicon layer the would eventually provide thin silicon waveguide 228, waveguide 230, and thin top silicon segments 216a and 216b. In some implementations, buried insulator layer 214 may be implemented as a BOX layer, as shown in FIG. 2A, such as a buried silicon dioxide ($SiO_2$) layer. In some of those implementations, the SOI substrate of SOI die 210 may be formed using a separation by implantation of oxygen (SIMOX) process, for example. In other implementations, buried insulator layer 214 may take the form of any other suitable dielectric, such as sapphire, for example. Thus, in some implementations, SOI die 210 may take the form of a silicon-on-sapphire (SOS) die. Nevertheless, buried insulator layer 214 will hereinafter be referred to as "BOX layer 214".

According to the implementation shown in FIG. 2A, light receiving segment 244 is situated over thin silicon waveguide 228 in IC region 218 of SOI die 210. Light receiving segment 244 may be a silicon nitride ($Si_3N_4$) segment having a height or thickness of approximately 400 nm, for example. In some implementations, a bottom surface of light receiving segment 244 may be approximately 100 nm above the top surface of thin silicon waveguide 228. Thus, a top surface of light receiving segment 244 may have an elevation of approximately 500 nm above the respective top surfaces of thin silicon waveguide 228 and thin top silicon segments 216a and 216b.

Metal hard mask 222a, metal hard mask 222b, and interconnect metal segment 222c may be patterned from the same interconnect metal layer, and may have substantially the same height or thickness. For example, interconnect metal segment 222c and metal hard masks 222a and 222b may be patterned from a first-level metal layer metallization (hereinafter "M1") of SOI die 210. Interconnect metal segment 222c and metal hard masks 222a and 222b may aluminum (Al) or copper (Cu) segments, for example, and each may have a height or thickness of approximately 500 nm.

Interconnect metal segment 242 may be patterned from a second-level metal layer metallization (hereinafter "M2") or subsequent-level metal layer metallization of SOI die 210. Interconnect metal segment 242, as well as die pad 236 may be formed of Al or Cu, for example. Conductive vias 238 and 240 may be conductively lined or conductively filled vias, for example.

Lower dielectric Layers 226 and upper dielectric layers 224 may be formed using any material and any technique typically employed in the art. For example, lower dielectric layers 226 and upper dielectric layers 224 may be formed of $SiO_2$, which may be deposited or thermally gown to produce lower dielectric layers 226 and upper dielectric layers 224. As another example, upper dielectric layers 224 and/or lower dielectric layers 226 may include one or more $Si_3N_4$, layers, which may be deposited. As yet another example, upper dielectric layers 224 and/or lower dielectric layers 226 may be formed of a dielectric material having a lower dielectric constant than $SiO_2$, such silicon oxycarbide (SiOC), for example. In some implementations, as shown in FIG. 2A, SOI die 210 may further include passivation layer 234 formed of $Si_3N_4$ polyamide, for example.

Moving to structure 202 in FIG. 2B, with continued reference to flowchart 100, in FIG. 1, flowchart 100 continues with forming photoresist 246 to protect IC region 218 and to expose pedestal region 220 (action 102). Photoresist 246 may be any suitable light sensitive organic material conventionally used in the art, and may be a positive or negative photoresist. Photoresist 246 may be selectively deposited over IC region 218 using a roller coating or spray coating technique, for example. Alternatively, photoresist 246 may be formed as a blanket layer over pedestal region 220 as well as IC region 218 using a spin coating or dip coating technique, and may then be selectively removed to expose pedestal region 220.

Thus, in implementations in which SOI die 210 includes passivation layer 234, exposure of pedestal region 220 in action 102 may further include selective removal of passivation layer 234 over pedestal region 220. Passivation layer 234 may be removed from over pedestal region 220 using any suitable technique utilized in the art. For example, where passivation layer 234 is formed of $Si_3N_4$, passivation layer 234 may be removed from over pedestal region 220 using a chemical dry etching technique utilizing sulfur hexafluoride ($SF_6$), or tetrafluoromethane ($CF_4$) supplemented with a small amount of nitrogen gas ($N_2$), for example.

Referring to cross-sectional structure 203, in FIG. 2C, in one implementation, flowchart 100 may continue with etching upper dielectric layers 224 above metal hard masks 222a and 222b in pedestal region 220 (action 103). Upper dielectric layers 224 may be etched away above metal hard masks 222a and 222b using any suitable etching techniques to which metal hard masks 222a and 222b serve as etch stops. For example, where upper dielectric layers 222 are formed of $SiO_2$, upper dielectric layers 224 may be etched away using $CF_4$ chemical dry etching.

It is noted that in implementations in which upper dielectric layers 224, lower dielectric layers 226, and BOX layer 214 are sensitive to the same etching process, action 103 results in etching away of lower dielectric layers 226 and BOX layer 214 adjacent to metal hard masks 222a and 222b in pedestal region 220, as well as etching away of upper dielectric layers 224 above metal hard masks 222a and 222b. Consequently, and as shown in FIG. 2C, sections of silicon handle wafer 212 not overlaid by metal hard masks 222a and 222b in pedestal region 220 may be exposed by action 103.

It is further noted that photoresist 246 masks IC region 218 during action 103, so that dielectric layers in IC region 218 are substantially unaffected by the etching performed in action 103.

Figure 2D:
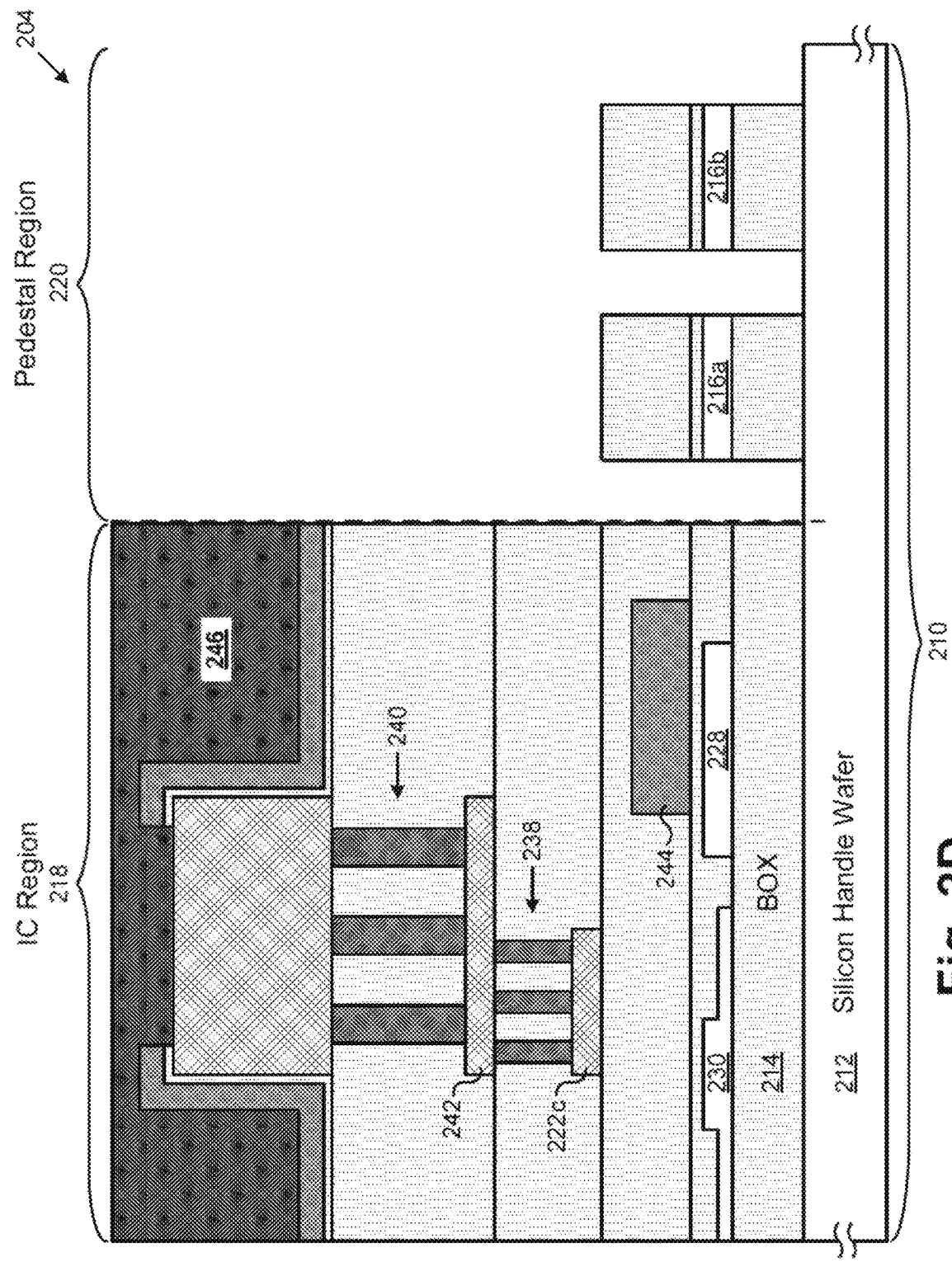
FIG. 2D shows a cross-sectional view of the exemplary structure of FIG. 2C at a subsequent fabrication stage according to the flowchart of FIG. 1.

Moving to structure 204, in FIG. 2D, flowchart 100 continues with removing metal hard masks 222a and 222b (action 104). Metal hard masks 222a and 222b may be removed using any suitable metal etching techniques known in the art. The specific chemicals utilized to remove metal hard masks 222a and 222b will vary depending on the metal composition of metal hard masks 222a and 222b. In most implementations, it is advantageous to utilize a metal etching technique that is selective against etching of $SiO_2$ in order to protect exposed sidewall portions of dielectric layers in IC region 218, and to protect exposed sidewall portions of lower dielectric layers 226 and BOX layer 214 in pedestal region 210.

Figure 2E:
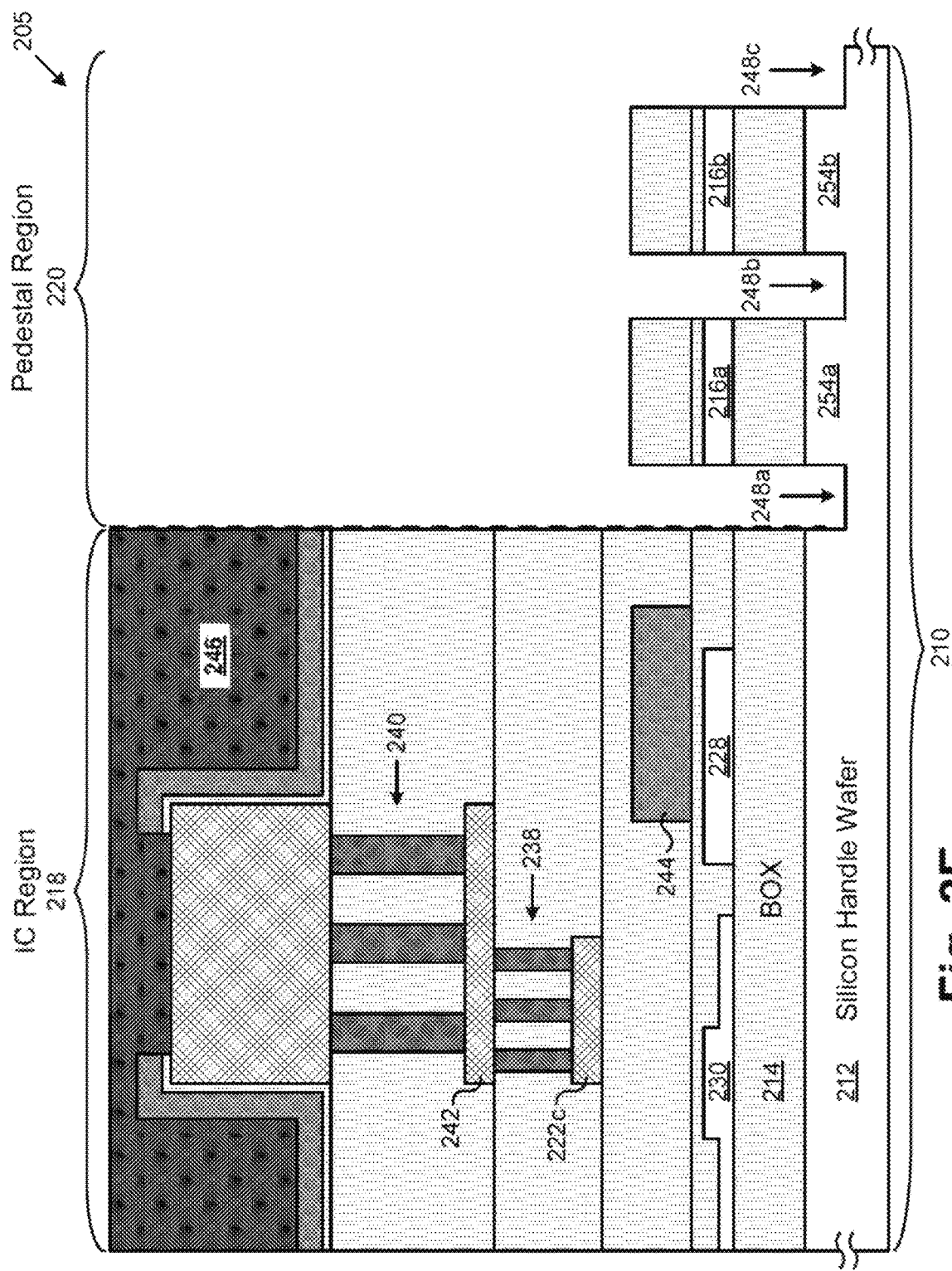
FIG. 2E shows a cross-sectional view of the exemplary structure of FIG. 2D at a subsequent fabrication stage according to the flowchart of FIG. 1.

Referring to structure 205, in FIG. 2E, flowchart 100 continues with etching trenches 248a, 248b, and. 248c in silicon handle wafer 212 to form handle wafer segments 254a and 254b below lower dielectric layers 226 in pedestal region 220 (action 105). Trenches 248a, 248b, and 248c may be etched using a chemical etching technique to which exposed sidewall portions of dielectric layers in IC region 218, exposed sidewall portions of lower dielectric layers 226 and BOX layer 214 in pedestal region 220, are resistant. For example, trenches 248a, 248b and 248c may be etched using $SF_6$ chemical dry etching. Trenches 248a, 248b, and 248c may be etched to a depth of up to approximately ten micrometers (10 μm). That is to say, handle wafer segments 254a and 254b may have a thickness or height of up to approximately 10 μm. With respect to the depiction of trenches 248a, 248b, and 248c in the present figures, as noted above, the drawings and illustrations in the present application are generally not to scale, and are not intended to correspond to actual relative dimensions.

Figure 2F:
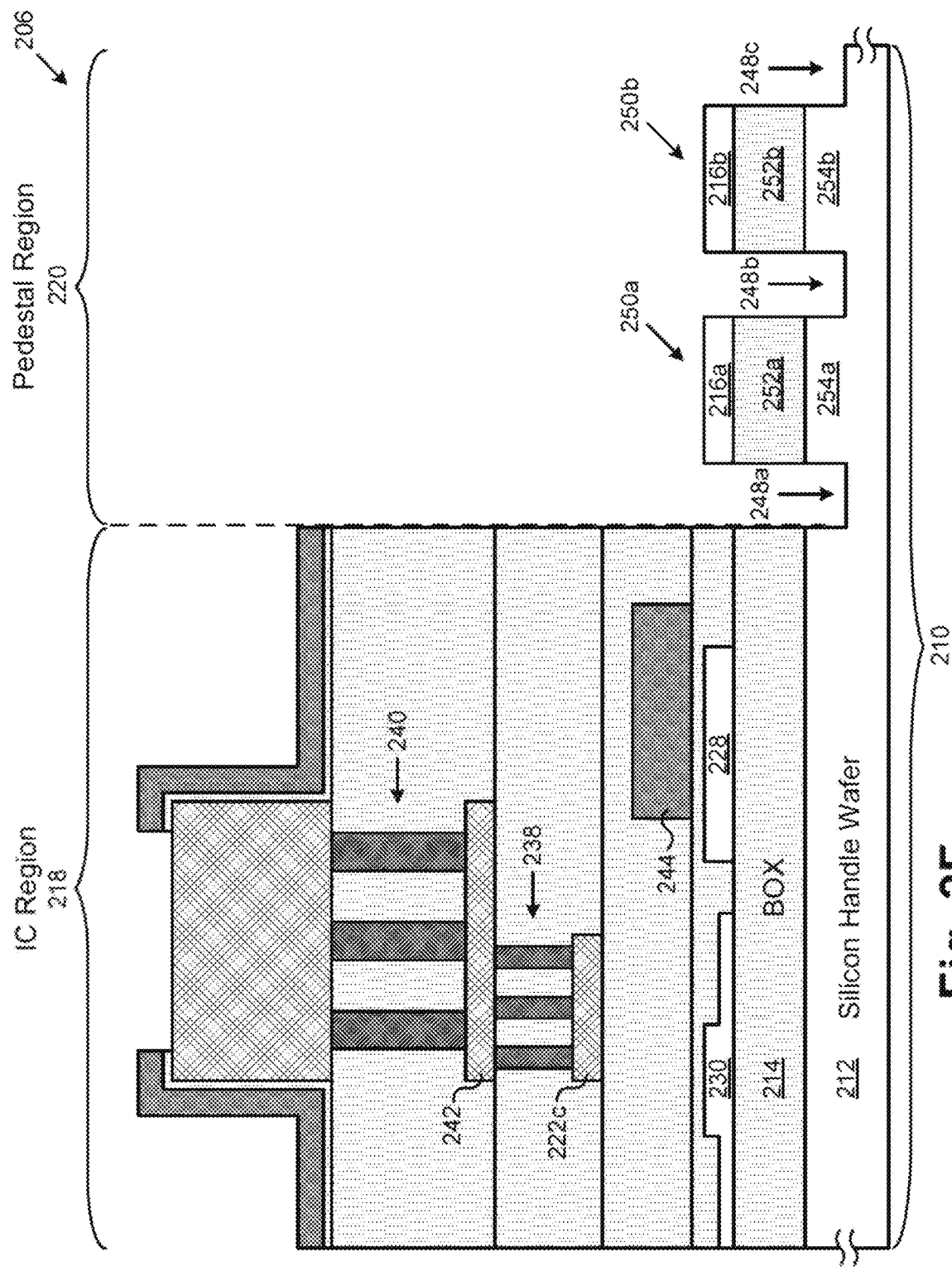
FIG. 2F shows a cross-sectional view of the exemplary structure of FIG. 2E at a subsequent fabrication stage according to the flowchart of FIG. 1.

Moving to structure 206, in FIG. 2F, flowchart 100 continues with using thin top silicon segments 216a and 216b in SOI die 210 as etch stops to etch lower dielectric layers 226 above thin top silicon segments 216a and 216b, thereby forming pedestals 250a and 250b including respective thin top silicon segments 216a and 216b, BOX segments 252a and 252b, and handle wafer segments 254a and 254b (action 106). As noted above, thin silicon waveguide 228 in IC region 218 is aligned with thin top silicon segments 216a and 216b capping respective pedestals 250a and 250b.

Lower dielectric layers 226 remaining above thin top silicon segments 216a and 216b after action 105 may be etched away in action 106 using a chemical etching process to which trenches 248a, 248b, and 248c in silicon handle wafer 212 are not sensitive. For example, lower dielectric layers 226 may be etched away from above thin top silicon segments 216a and 216b using hydrogen fluoride (HF). As further shown in FIG. 2F, action 106 can include removing photoresist 246 from over IC region 218 of SOI die 210.

Figure 2G:
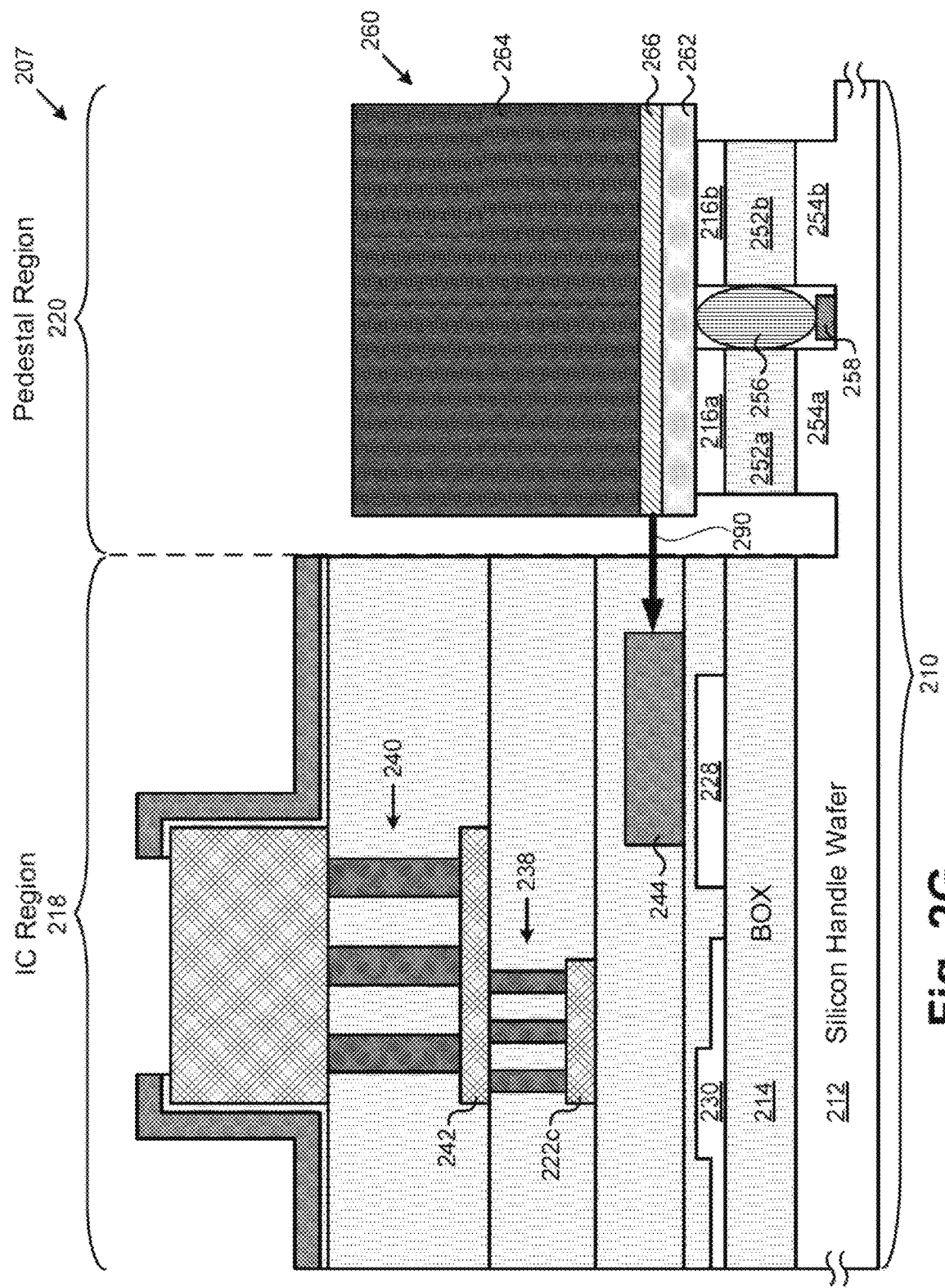
FIG. 2G shows a cross-sectional view of the exemplary structure of FIG. 2F at a subsequent fabrication stage according to the flowchart of FIG. 1.

Flowchart 100 can conclude with situating photonics device 260 providing light emitting layer 266 over pedestals 250a and 250b, light emitting layer 266 being aligned with light receiving segment 244 situated over thin silicon waveguide 228 (action 107). Structure 207 in FIG. 2G shows photonics device 260 situated over pedestals 250a and 250b, and being secured over pedestals 250a and 250b by solder body 256 and under bump metallization (UBM) 258 situated in trench 248b used in forming handle wafer segments 254a and 254b of respective pedestal 250a and 250b. However, the depiction provided in FIG. 2G is merely exemplary. In other implementations, photonics device 260 may be situated over and supported by a single pedestal, i.e., one of pedestals 250a or 250b. Moreover, in implementations in which photonics device 260 is situated over a single pedestal, photonics device 260 may be secured over the pedestal by solder body 256 and UBM 258 situated adjacent that pedestal.

Photonics device 260 may be a group III-V semiconductor device providing light emitting layer 266. For example, photonics device 260 may take the form of a group III-V laser, for example, a laser diode or a quantum well laser. In such an implementation, photonics device 260 may include P type anode 262, N type cathode 264, and light emitting layer 266 situated between P type anode 262 and N type cathode 264. Moreover, and as shown in FIG. 2G, in some implementations, P type anode 262 may be situated under light emitting layer 266 and N type cathode 264 may be situated over light emitting layer 266.

P type anode 262 of photonics device 260 may be a highly doped P+ type indium gallium arsenide (InGaAs) anode, for example. Moreover, N type cathode 264 of photonics device 260 may be a highly doped N+ type indium phosphide (InP) cathode, for example. Light emitting layer 266 may be a modulation doped layer, that is to say, a layer that is not intentionally doped, having a height or thickness of tens of nanometers, such as less than or equal to 50 nm, for example. Light emitting layer 266 may be an indium gallium aluminum arsenide (InGaAlAs) layer, for example.

UBM 258 is provided to adhere solder body 256 over silicon handle wafer 212, as well as to prevent unwanted diffusion from solder body 256 into silicon handle wafer 212. UBM 258 may be implemented as a thin-film metal or metal alloy stack stencil printed onto a bottom surface of trench 248b, for example, and having a composition that may vary depending on the composition of solder body 256. In some implementations, solder body 256 may comprise gold (Au) and tin (Sn), for example. When solder body 256 is such a AuSn solder body, UBM 258 may take the form of thin-film titanium-copper (Ti—Cu), titanium/tungsten-copper (TiW—Cu), or chromium-chromium/copper-copper (Cr—CrCu—Cu), for example.

As disclosed above, by using metal segments 222a and 222b patterned from M1 of SOI die 210 as a metal hard mask providing an etch stop during removal of upper dielectric layers 224 from pedestal region 220, the present method advantageously protects pedestal structures for additional processing. In addition, by using thin top silicon segments 216a and 216b patterned from a thin top silicon layer of SOI die 210 as an etch stop when forming one or more pedestals 250a and/or 250b designed to support photonics device 260, the present method further advantageously ensures alignment of light emitting layer 266 of photonics device 260 in pedestal region 220 with light receiving segment 244 situated over thin silicon waveguide 228 in IC region 218. In this advantageously aligned structure described above, light beams emitted from light is emitting layer 266 of photonics device 260, such as exemplary light beam 290, shine precisely on light receiving segment 244 due to the precise alignment.

As another exemplary implementation of the method outlined in flowchart 100, and referring to FIG. 1 in combination with cross-sectional structure 301 in FIG. 3A, flowchart 100 can begin with providing SOI die 310 having IC region 318 and pedestal region 320, pedestal region 320 including interconnect metal segments 342a and 342b for use as metal hard masks (hereinafter "metal hard masks 342a and 342b"), metal hard masks 342a and 342b being below upper dielectric layers 324 and above lower dielectric layers 326, IC region 318 including thin silicon waveguide 328 (action 101). As shown in the cross-sectional view of FIG. 3A, SOI die 310 also includes silicon handle wafer 312, which may be a bulk silicon wafer, for example, and buried insulator layer 314 shown as an exemplary BOX layer situated between silicon handle wafer 312 and thin silicon waveguide 328, as well as waveguide 330 and thin top silicon segments 316a and 316b.

In addition, and as further shown in FIG. 3A, structure 301 includes light receiving segment 344, die pad 336, and interconnect metal segments 342c and 322 all situated in IC region 318. Structure 301 is also shown to include electrically conductive vias 340 electrically connecting die pad 336 to interconnect metal segment 342c, and electrically conductive vias 338 electrically connecting die pad 336 and interconnect metal segment 342c to interconnect metal segment 322 in IC region 318. Also shown in FIG. 3A is passivation layer 334.

It is noted that thin silicon waveguide 328, waveguide 330, and thin top silicon segments 316a and 316b are patterned from the same thin top silicon layer of a SOI substrate of SOI die 310 also including silicon handle wafer 312 and buried insulator layer 314. Consequently, thin top silicon segments 316a and 316b are aligned with thin silicon wave guide 328. That is to say, thin top silicon segments 316a and 316b have substantially the same height or thickness as thin silicon waveguide 328, such as a height or thickness of approximately 220 nm, for example. Moreover, the respective top surfaces of thin top silicon segment 316a, thin top silicon segment 316b, and thin silicon waveguide 328 lie on the same horizontal plane substantially perpendicular to cross-sectional structure 301.

In some implementations, the SOI substrate of SOI die 310 may be formed by wafer bonding, whereby buried insulator layer 314 would be eventually situated between silicon handle wafer 312 and a thin top silicon layer the would eventually provide thin silicon waveguide 328, waveguide 330, and thin top silicon segments 316a and 316b. In some implementations, buried insulator layer 314 may be implemented as a BOX layer, as shown in FIG. 3A, such as a buried $SiO_2$ layer. In some of those implementations, the SOI substrate of SOI die 310 may be formed using a SIMOX process, for example. In other implementations, buried insulator layer 314 may take the form of any other suitable dielectric, such as sapphire, for example. Thus, in some implementations, SOI die 310 may take the form of a SOS die. Nevertheless, buried insulator layer 314 will hereinafter be referred to as "BOX layer 314."

According to the implementation shown in FIG. 3A, light receiving segment 344 is situated over thin silicon waveguide 328 in IC region 318 of SOI die 310. Light receiving segment 344 may be a $Si_3N_4$ segment having a height or thickness of approximately 400 nm, for example. In some implementations, a bottom surface of light, receiving segment 344 may be approximately 100 nm above the top surface of thin silicon waveguide 328. Thus, a top surface of light receiving segment 344 may have an elevation of approximately 500 nm above the respective top surfaces of thin silicon waveguide 328 and thin top silicon segments 316a and 316b.

Metal hard mask 342a, metal hard mask 342b, and interconnect metal segment 342c may be patterned from the same interconnect metal layer, and may have substantially the same height or thickness. For example, interconnect metal segment 342c and metal hard masks 342a and 342b may be patterned from a second-level metal layer metallization (hereinafter "M2") or subsequent-level metal layer metallization of SOI die 310. Interconnect metal segment 342c and metal hard masks 342a and 342b may Al or Cu segments, for example, and each may have a height or thickness of approximately 500 nm.

Importantly, it is noted that in the present exemplary implementation, metal hard masks 342a and 342b are situated in second-level metal layer metallization or subsequent-level metal layer metallization (i.e. M2, or above). In contrast, metal hard masks 222a and 222b in the exemplary implementation described in relation to FIGS. 2A through 2G are situated in first-level metal layer metallization (i.e. M1).

Interconnect metal segment 322 may be patterned from M1 of SOI die 310. Interconnect metal segment 322, as well as die pad 336 may be formed of Al or Cu, for example. Conductive vias 338 and 340 may be conductively lined or conductively filled vias, for example.

Lower dielectric layers 326 and upper dielectric layers 324 may be formed using any material and any technique typically employed in the art. For example, lower dielectric layers 326 and upper dielectric layers 324 may be formed of $SiO_2$, which may be deposited or thermally grown to produce lower dielectric layers 326 and upper dielectric layers 324. As another example upper dielectric layers 324 an/or lower dielectric layers 326 may include one or more $Si_3N_4$, layers, which may be deposited. As yet another example, upper dielectric layers 324 and/or lower dielectric layers 326 may be formed of a dielectric material having a lower dielectric constant than $SiO_2$, such SiOC, for example. In some implementations, as shown in FIG. 3A, SOI die 310 may further include passivation layer 334 formed of $Si_3N_4$ or polyamide, for example.

Moving to structure 302 in FIG. 3B, with continued reference to flowchart 100, in FIG. 1, flowchart 100 continues with forming photoresist 346 to protect IC region 318 and to expose pedestal region 320 (action 102). Photoresist 346 may be any suitable light sensitive organic material conventionally used in the art, and may be a positive or negative photoresist. Photoresist 346 may be selectively deposited over IC region 318 using a roller coating or spray coating technique, for example. Alternatively, photoresist 346 may be formed as a blanket layer over pedestal region 320 as well as IC region 318 using a spin coating or dip coating technique, and may then be selectively removed to expose pedestal region 320.

Thus, in implementations in which SOI die 310 includes passivation layer 334, exposure of pedestal region 320 in action 102 may further include selective removal of passivation layer 334 over pedestal region 320. Passivation layer 334 may be removed front over pedestal region 320 using any suitable technique utilized in the art. For example, where passivation layer 334 is formed of $Si_3N_4$, passivation layer 334 may be removed from over pedestal region 320 using a chemical dry etching technique utilizing sulfur $SF_6$, or $CF_4$ supplemented with a small amount of $N_2$, for example.

Referring to cross-sectional structure 303, in FIG. 3C, in one implementation, flowchart 100 may continue with etching upper dielectric layers 324 above metal hard masks 342a and 342b pedestal region 320 (action 103). Upper dielectric layers 324 may be etched away above metal hard masks 342a and 342b using any suitable etching techniques to which metal hard masks 342a and 342b serve as etch stops. For example, where upper dielectric layers 324 are formed of $SiO_2$, upper dielectric layers 324 may be etched away using $CF_4$ chemical day etching.

It is noted that in implementations in which upper dielectric layers 324, lower dielectric layers 326, and BOX layer 314 are sensitive to the same etching process, action 103 results in etching away of lower dielectric layers 326 and BOX layer 314 adjacent to metal hard masks 342a and 342b in pedestal region 320, as well as etching away of upper dielectric layers 324 above metal hard masks 342a and 342b. Consequently, and as to shown in FIG. 3C, sections of silicon handle wafer 312 not overlaid by metal hard masks 342a and 342b in pedestal region 320 may be exposed by action 103. It is further noted that photoresist 346 masks IC region 318 during action 103, so that dielectric layers in IC region 318 are substantially unaffected by the etching performed in action 103.

Figure 3D:
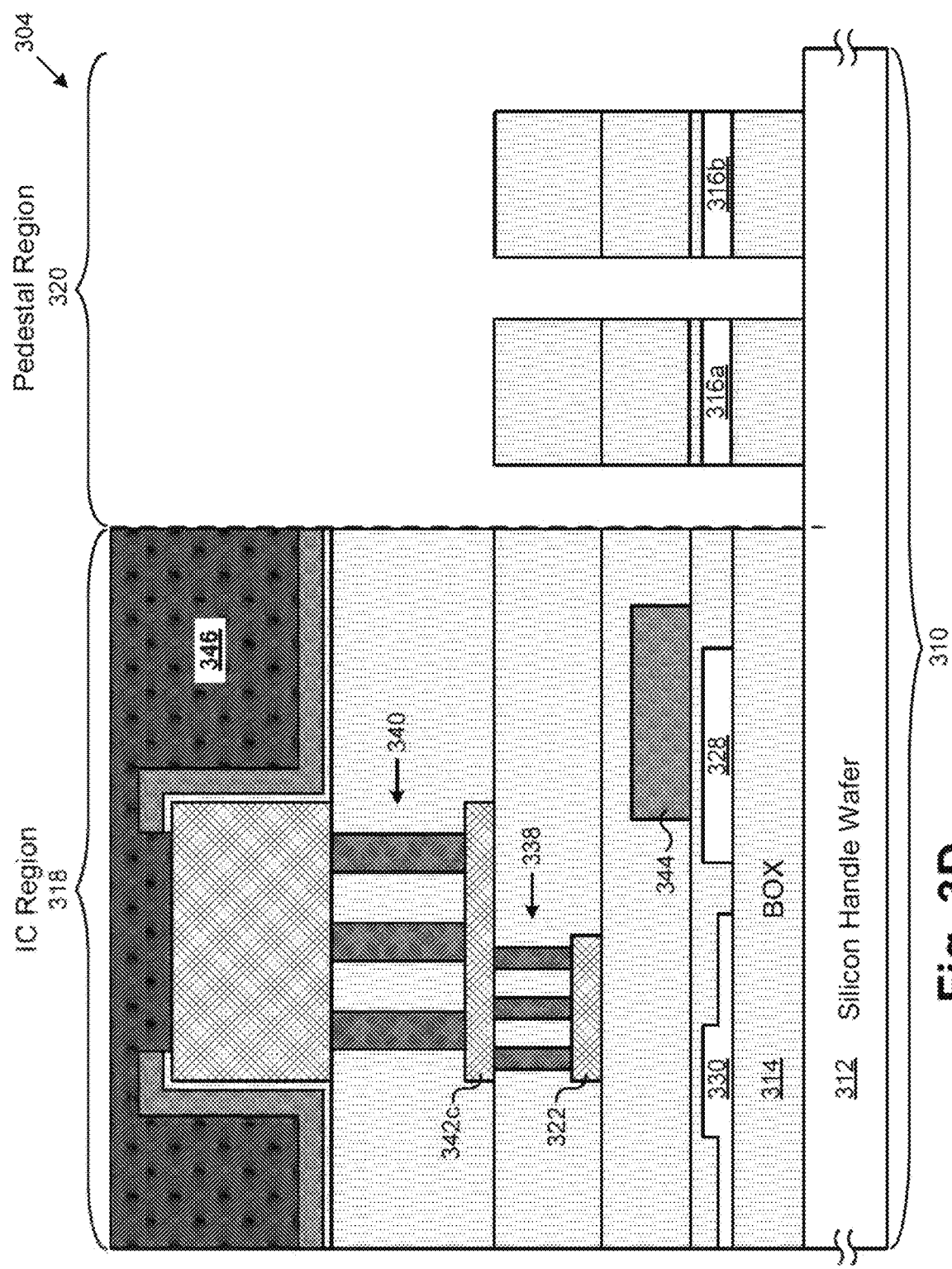
FIG. 3D shows a cross-sectional view of the exemplary structure of FIG. 3C at a subsequent fabrication stage according to the flowchart of FIG. 1.

Moving to structure 304, in FIG. 3D, flowchart 100 continues with removing metal hard masks 342a and 342b (action 104). Metal hard masks 342a and 342b may be removed using any suitable metal etching techniques known in the art. The specific chemicals utilized to remove metal hard masks 342a and 342b will vary depending on the metal composition of metal hard masks 342a and 342b. In most implementations, it is advantageous to utilize a metal etching technique that is selective against etching of $SiO_2$ in order to protect exposed sidewall portions of dielectric layers in IC region 318, and to protect exposed sidewall portions of lower dielectric layers 326 and BOX layer 314 in pedestal region 320.

Figure 3E:
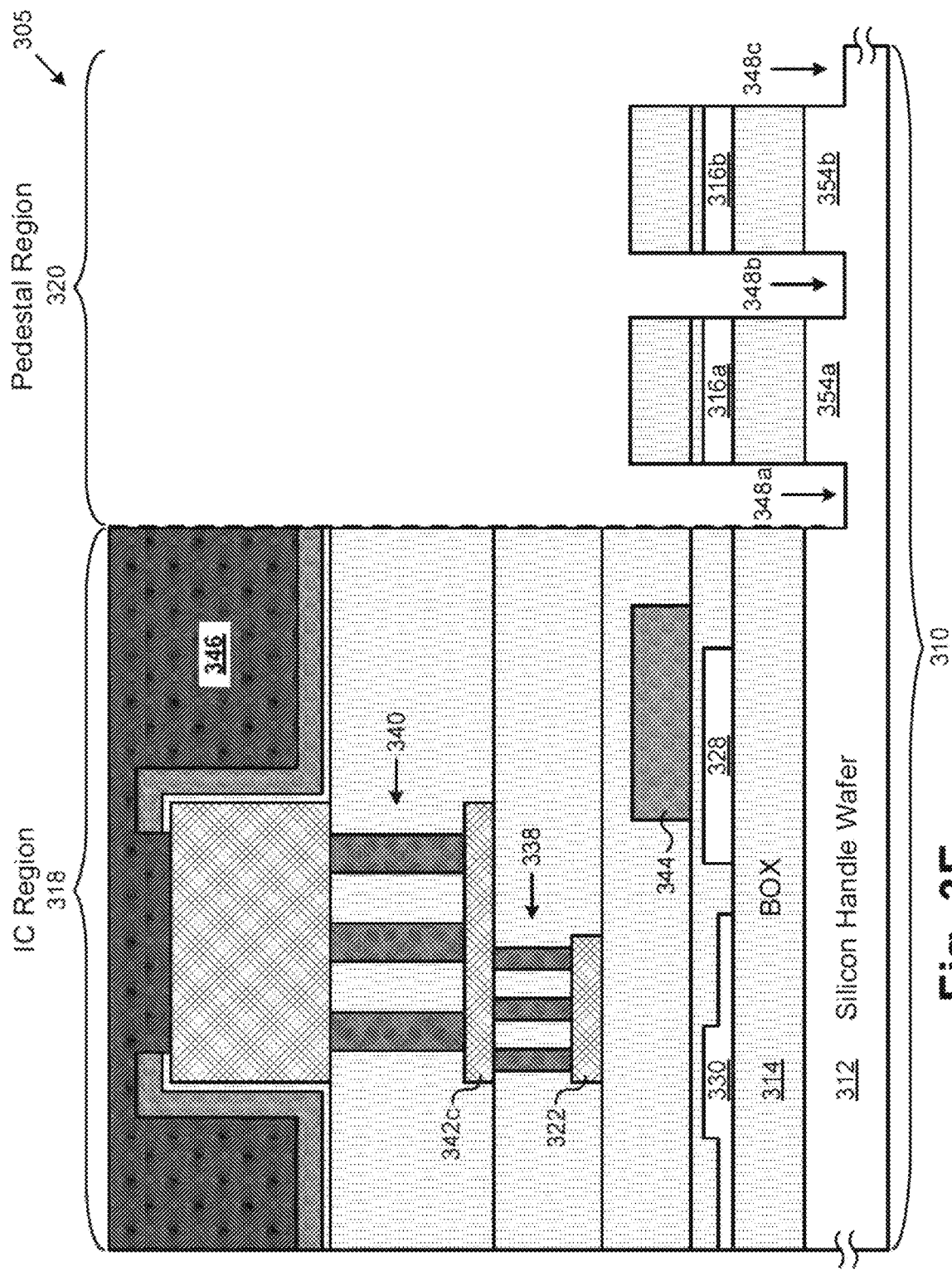
FIG. 3E shows a cross-sectional view of the exemplary structure of FIG. 3D at a subsequent fabrication stage according to the flowchart of FIG. 1.

Referring to structure 305, in FIG. 3E, flowchart 100 continues with etching trenches 348a, 348b and 348c in silicon handle wafer 312 to form handle wafer segments 354a and 354b below lower dielectric layers 326 in pedestal region 320 (action 105). Trenches 348a, 348b, and 348c may be etched using a chemical etching technique to which exposed sidewall portions of dielectric layers in IC region 318, exposed sidewall portions of lower dielectric layers 326 and BOX layer 314 in pedestal region 320, are resistant. For example, trenches 348a, 348b, and 348c may be etched using $SF_6$ chemical dry etching. Trenches 348a, 348b and 348c may be etched to a depth of up to approximately 10 μm. That is to say, handle wafer segments 354a and 354b may have a thickness or height of up to approximately 10 μm. With respect to the depiction of trenches 348a, 348b, and 348c in the present figures, as noted above, the drawings and illustrations in the present application are generally not to scale, and are not intended to correspond to actual relative dimensions.

Figure 3F:
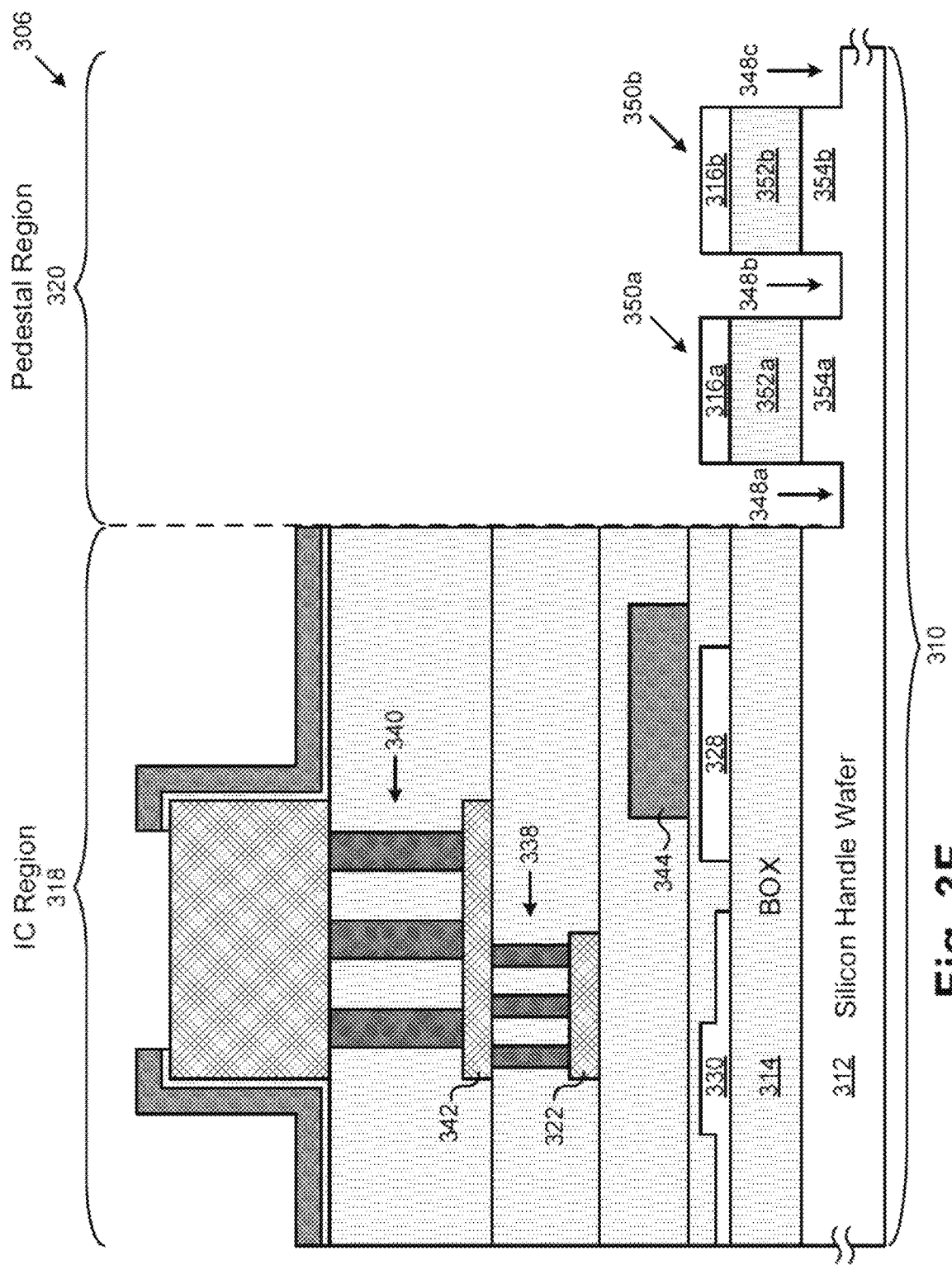
FIG. 3F shows a cross-sectional view of the exemplary structure of FIG. 3E at a subsequent fabrication stage according to the flowchart of FIG. 1.

Moving to structure 306, in FIG. 3F, flowchart 100 continues with using thin top silicon segments 316a and 316b in SOI die 310 as etch stops to etch lower dielectric layers 326 above thin top silicon segments 316a, and 316b, thereby forming pedestals 350a and 350b including respective thin top silicon segments 316a and 316bb, BOX segments 352a and 352b, and handle wafer segments 354a and 354b (action 106). As noted above, thin silicon waveguide 328 in IC region 318 is aligned with thin top silicon segments 316a and 316b capping respective pedestals 350a and 350b.

Lower dielectric layers 326 remaining above thin top silicon segments 316a and 316b after action 105 may be etched away in action 106 using a chemical etching process to which trenches 248a, 348b, and 348c in silicon handle wafer 312 are not sensitive. For example, lower dielectric layers 326 may be etched away from above thin top silicon segments 316a and 316b using hydrogen fluoride (HF). As further shown in FIG. 3F, action 106 can include removing photoresist 346 from over IC region 318 of SOI die 310.

Figure 3G:
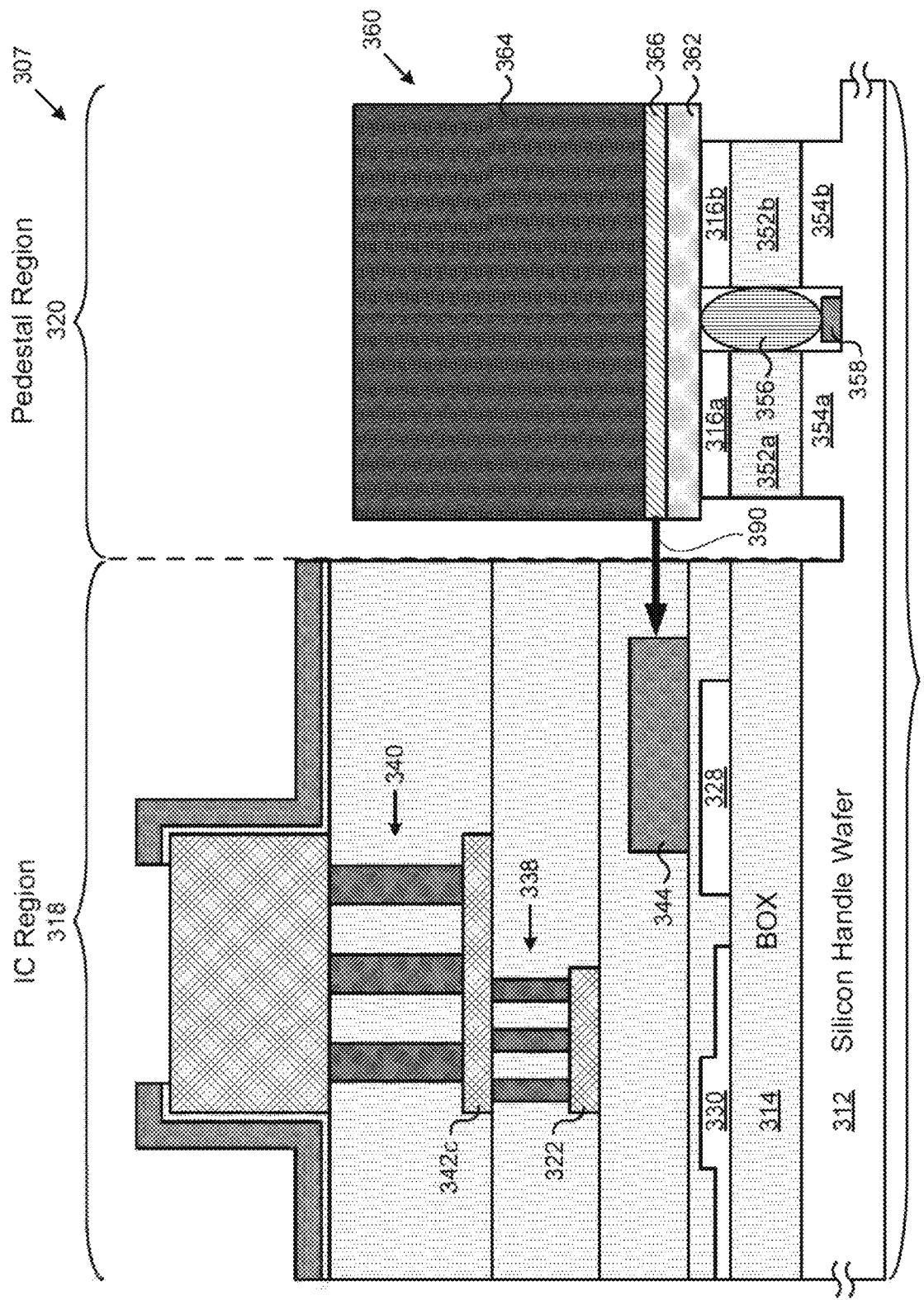
FIG. 3G shows a cross-sectional view of the exemplary structure of FIG. 3F at a subsequent fabrication stage according to the flowchart of FIG. 1.

Flowchart 100 can conclude with situating photonics device 360 providing light emitting layer 366 over pedestals 350*a* and 350*b,* light emitting layer 366 being aligned with light receiving segment 344 situated over thin silicon waveguide 328 (action 107). Structure 307 in FIG. 3G shows photonics device 360 situated over pedestals 350*a* and 350*b,* and being secured over pedestals 350*a* and 350*b* by solder body 356 and under UBM 358 situated in trench 348*b* used in forming handle wafer segments 354*a* and 354*b* of respective pedestal 350*a* and 350*b*. However, the depiction provided in FIG. 3G is merely exemplary. In other implementations, photonics device 360 may be situated over and supported by a single pedestal, i.e., one of pedestals 350*a* or 350*b*. Moreover, in implementations in which photonics device 360 is situated over a single pedestal, photonics device 360 may be secured over the pedestal by solder body 356 and 6UBM 358 situated adjacent that pedestal.

Photonics device 360 may be a group III-V semiconductor device providing light emitting layer 366. For example, photonics device 360 may take the form of a group III-V laser, such as a laser diode or a quantum well laser. In such an implementation, photonics device 360 may include P type anode 362, N type cathode 364, and light emitting layer 366 situated between P type anode 362 and N type cathode 364. Moreover, and as shown in FIG. 3G, in some implementations, P type anode 362 may be situated under light emitting layer 366 and N type cathode 364 may be situated over light emitting layer 366.

P type anode 362 of photonics device 360 may be a highly doped P+ type InGaAs anode, for example. Moreover, N type cathode 364 of photonics device 360 may be a highly doped N+ type InP cathode, for example. Light emitting layer 366 may be a modulation doped layer, that is to say, a layer that is not intentionally doped, having a height or thickness of tens of nanometers, such as less than or equal to 50 nm, for example. Light emitting layer 366 may be an indium gallium aluminum arsenide (InGaAlAs) layer, for example.

UBM 358 is provided to adhere solder body 356 over silicon handle wafer 312, as well as to prevent unwanted diffusion from solder body 356 into silicon handle wafer 312. UBM 358 may be implemented as a thin-film metal or metal alloy stack stencil printed onto a bottom surface of trench 348*b*, for example, and having a composition that may vary depending on the composition of solder body 356. In some implementations, solder body 356 may comprise Au and Sn, for example. When solder body 356 is such a AuSn solder body, UBM 358 may take the form of thin-film Ti—Cu, TiW—Cu, or Cr—CrCu—Cu, for example.

As disclosed above, by using metal segments 342*a* and 342*b* patterned from M2 or subsequent-level metal layer metallization of SOI die 310 as a metal hard mask providing an etch stop during removal of upper dielectric layers 324 from pedestal region 320, the present method advantageously protects pedestal structures for additional processing. In addition, by using thin top silicon segments 316*a* and 316*b* patterned from a thin top silicon layer of SOI die 310 as an etch stop when forming one or more pedestals 350*a* and/or 350*b* designed to support photonics device 360, the present method further advantageously ensures alignment of light emitting layer 366 of photonics device 360 in pedestal region 320 with light receiving segment 344 situated over thin silicon waveguide 328 in IC region 318. In this advantageously aligned structure described above, light beams emitted from light emitting layer 366 of photonics device 360, such as exemplary light beam 390, shine precisely on light receiving segment 344 due to the precise alignment.

Thus, the present application discloses an SOI die including a light emitting layer to pedestal-aligned with a light receiving segment and methods for its fabrication. As discussed above, the fabrication method includes using one or more metal segments patterned from one of a first-level, second-level, or subsequent level metal layer metallization as a metal hard mask providing an etch stop during removal of upper dielectric layers from a pedestal region of the SOI die. In addition, a top silicon layer of the SOI die used to form a thin silicon waveguide in an IC region of the SOI die provides one or more thin top silicon segments in the pedestal region that serve as an etch stop when forming a pedestal or pedestals designed to support a photonics device. Consequently, the present fabrication method and resulting SOI die advantageously ensure alignment of a light emitting layer of the photonics device in the pedestal region of the SOI die with a light receiving segment situated over the thin silicon waveguide in the IC region.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A silicon-on-insulator (SOI) die comprising:
a pedestal region of said SOI die including a pedestal comprising a thin top silicon segment, a buried oxide (BOX) segment, and a handle wafer segment;
an integrated circuit (IC) region comprising a thin silicon waveguide that is aligned with said thin top silicon segment in said pedestal region;
a light emitting layer situated over said pedestal, said light emitting layer being aligned with a light receiving segment situated over said thin silicon waveguide.

2. The SOI die of claim 1, wherein said light receiving segment comprises silicon nitride.

3. The SOI die of claim 1, further comprising a photonics device providing said light emitting layer.

4. The SOI die of claim 3, wherein said photonics device comprises a group III-V device.

5. The SOI die of claim 3, wherein said photonics device comprises a laser.

6. The SOI die of claim 3, wherein said photonics device comprises a laser diode.

7. The SOI die of claim 3, wherein said photonics device is secured over said pedestal by a solder body and an under bump metallization (UMB) situated adjacent said pedestal.

8. The SOI die of claim 7, wherein said UMB is situated in a trench formed in a handle wafer of said SOI die.

9. A method comprising:
providing a silicon-on-insulator (SOI) die having an integrated circuit (IC) region and a pedestal region, said pedestal region including an interconnect metal segment for use as a metal hard mask, said metal hard mask being below upper dielectric layers and above lower dielectric layers, said IC region including a thin silicon waveguide;

forming photoresist to protect said IC region and to expose said pedestal region;

etching said upper dielectric layers above said metal hard mask;

removing said metal hard mask;

etching trenches so as to form a handle wafer segment below said lower dielectric layers;

using a thin top silicon segment in said pedestal region as an etch stop to etch said lower dielectric layers, thereby forming a pedestal comprising said thin top silicon segment, a buried oxide (BOX) segment, and said handle wafer segment, said thin top silicon segment in said pedestal region being aligned with said thin silicon waveguide in said IC region.

10. The method of claim 9, wherein said interconnect metal segment for use as said metal hard mask comprises a first-level metal layer metallization segment of said SOI die.

11. The method of claim 9, wherein said interconnect metal segment for use as said metal hard mask comprises a second-level or subsequent-level metal layer metallization segment of said SOI die.

12. The method of claim 9, wherein said upper dielectric layers comprise silicon dioxide.

13. The method of claim 9, wherein said lower dielectric layers comprise silicon dioxide.

14. The method of claim 9, further comprising situating a photonics device providing a light emitting layer over said pedestal in said pedestal region, said light emitting layer being aligned with a light receiving segment situated over said thin silicon waveguide in said IC region.

15. The method of claim 14, wherein said light receiving segment comprises silicon nitride.

16. The method of claim 14, wherein said photonics device comprises a group III-V device.

17. The method of claim 14, wherein said photonics device comprises a laser.

18. The method of claim 14, wherein said photonics device comprises a laser diode.

19. The method of claim 14, wherein said photonics device is secured over said pedestal by a solder body and an under bump metallization (UMB) situated adjacent said pedestal.

20. The method of claim 19, wherein said UMB is situated in one of said trenches used in forming said handle wafer segment of said pedestal.

* * * * *